United States Patent
Lin et al.

(10) Patent No.: US 6,249,022 B1
(45) Date of Patent: Jun. 19, 2001

(54) TRENCH FLASH MEMORY WITH NITRIDE SPACERS FOR ELECTRON TRAPPING

(75) Inventors: Chih-Hung Lin, Hsinchu; Robin Lee, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/425,395

(22) Filed: Oct. 22, 1999

(51) Int. Cl.$^7$ .................................................. H01L 21/8228
(52) U.S. Cl. ............................................. 257/324; 257/314
(58) Field of Search ..................................... 257/314, 315, 257/316, 324, 325, 302; 438/201, 211, 257

(56) References Cited

U.S. PATENT DOCUMENTS

| | | | |
|---|---|---|---|
| 5,429,970 | * 7/1995 | Hong | 437/43 |
| 5,606,521 | * 2/1997 | Kuo et al. | 365/149 |
| 5,675,161 | * 10/1997 | Thomas | 257/316 |
| 5,736,765 | * 4/1998 | Oh et al. | 257/321 |
| 5,877,537 | * 3/1999 | Aoki | 257/390 |
| 6,091,102 | * 7/2000 | Sekariapuram et al. | 257/316 |

* cited by examiner

Primary Examiner—Steven Loke
Assistant Examiner—Douglas W. Owens
(74) Attorney, Agent, or Firm—Thomas, Kayden, Horstemeyer & Risley, LLP

(57) ABSTRACT

A method for fabricating a flash memory cell is described. A conformal ultra thin oxide layer is formed on a substrate having a trench formed therein, followed by forming silicon nitride spacers on the portion of the ultra thin oxide layer which covers the sidewalls of the trench. The silicon nitride spacers are separated into a first silicon nitride spacer on the right sidewall and a second silicon nitride spacer on the left sidewall. Thereafter, a gate oxide layer is formed on the silicon nitride spacers, followed by forming a polysilicon gate on the gate oxide layer in the substrate. Subsequently, a source/drain region is formed on both sides of the polysilicon gate in the substrate.

5 Claims, 3 Drawing Sheets

TRENCH FLASH MEMORY WITH NITRIDE SPACERS FOR ELECTRON TRAPPING

BACKGROUND OF THE INVENTION

1. Field of the Invention

The present invention relates to a fabrication method for an integrated circuit device. More particularly, the present invention relates to a fabrication method for a flash memory cell.

2. Description of the Related Art

FIG. 1 is a schematic, cross-sectional view of a flash memory cell according to the prior art. Beside an oxide layer not being shown in the Figure, the conventional flash memory cell, as illustrated in FIG. 1, comprises a polysilicon gate 104, a silicon nitride layer 102, a source region 106a and a drain region 106b, wherein the source/drain region 106a, 106b are formed near the two sides of the silicon nitride layer 102 in the substrate 100.

There are two approaches for the above flash memory cell to perform the programming operation. One approach is to apply a positive voltage to the polysilicon gate 104 and a lesser positive voltage to the drain region 106b. Hot electrons are thus injected into and trapped in one end of the silicon nitride layer 102 near the drain region 106b. Another approach is to apply a positive voltage to the polysilicon gate 104 and a lesser positive voltage to the source region 106a. The hot electrons are injected onto and trapped in one end of the silicon nitride layer 102 near the source region 106a.

One drawback of the conventional flash memory cell is that the hot electrons do not necessarily stay in the two ends of the silicon nitride layer 102. These hot electrons sometimes redistribute themselves in the silicon nitride layer 102. The occurrence of redistribution not only poses difficulties in the reading operation, it also leads to the serious problem of an over-erase.

SUMMARY OF THE INVENTION

Based on the foregoing, the current invention provides a fabrication method for a flash memory cell in which the problem of redistribution is prevented; the problem of over-erasure of a flash memory cell is also improved. The method of the present invention includes forming a shallow trench in a substrate, wherein the trench comprises a left sidewall and a right sidewall. A conformal oxide layer is then formed on the substrate. Thereafter, a first silicon nitride spacer is formed on the ultra thin oxide layer that covers the left sidewall of the shallow trench. Concurrently, a second silicon nitride spacer is formed on the ultra thin oxide layer that covers the right sidewall of the trench. A second oxide layer is then formed covering the first silicon nitride spacer and the second silicon nitride spacer. A polysilicon gate is further formed in the trench covering the second oxide layer. Subsequently, an ion implantation is conducted to form the source/drain region at the two sides of the gate in the substrate.

According to the preferred embodiment of the present invention, the second oxide layer is formed by growing an oxide layer on the first and the second silicon nitride spacers via a thermal oxidation process. The first oxide layer, which is not covered by the first and the second silicon nitride spacer, would becomes thicker. A second method of forming the second oxide layer includes deposition.

The first and the second silicon nitride spacers mentioned in the above are formed by forming a silicon nitride layer in the substrate and excessively filling the trench, followed by back-etching the silicon nitride layer using the substrate outside the trench as an etching end-point.

In other words, the present invention provides a two-bit flash memory cell, wherein the flash memory cell includes a substrate comprising a trench. The trench is sequentially filled with the following components. A conformal first oxide layer is formed on the trench, followed by forming silicon nitride spacers on the first oxide layer, which covers the sidewalls of the trench. A second oxide layer is then formed on the silicon nitride spacers, to sufficiently cover the silicon nitride spacers. A polysilicon gate, excessively filling the shallow trench, is formed on the second oxide layer, wherein a source/drain region is further formed on both sides of the polysilicon gate.

A special characteristic of the present invention is the formation of the silicon nitride spacers to cover the sidewalls of the shallow trench. Although, the conventional flash memory cell also comprises a silicon nitride layer, the present invention provides two isolated silicon nitride spacers for storing data, data of two bits can be stored by allocating four different levels of the reading current. In another words, a two-bit flash memory cell is provided. Furthermore, with two isolated silicon nitride spacers rather than a single silicon nitride layer, charge redistribution is less likely to occur in the flash memory cell. The problem of an over-erase can thereby be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 2:
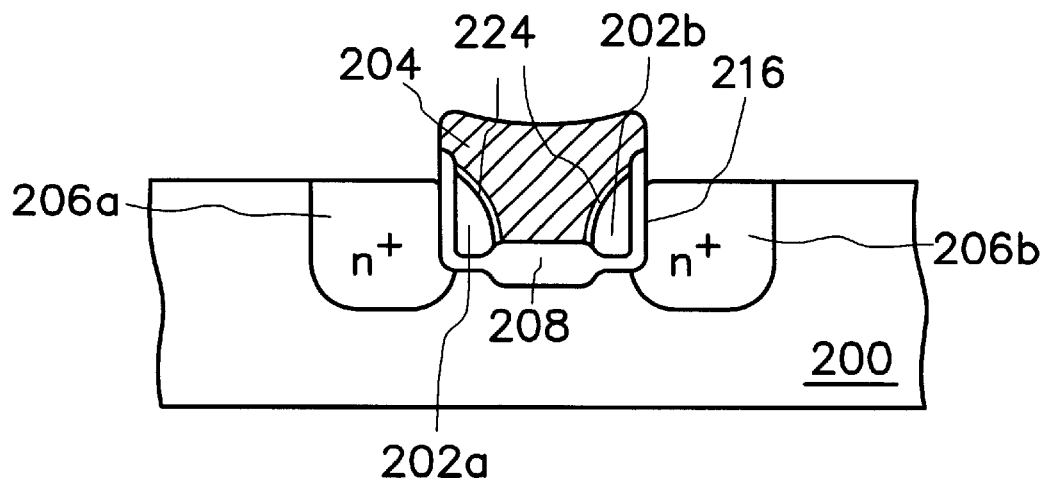
FIG. 2 is a schematic, cross-sectional view of a flash memory cell according to the present invention.

FIG. 2 is a schematic, cross-sectional view of a flash memory cell according to the present invention.

Referring to FIG. 2, the flash memory cell provided in the preferred embodiment of the present invention is a two-bit silicon nitride oxide semiconductor (SNOS) flash memory cell.

As shown in FIG. 2, the present invention provides a flash memory cell, which is a 2-bit SNOS flash memory cell. The flash memory cell includes a substrate 200 having a trench 216. Sequential formations in the trench include formation of a conformal first oxide layer 208. Silicon nitride spacers 202a, 202b are then formed on the first oxide layer 208, which covers the sidewalls of the trench 216. A second oxide layer 224 is then formed to sufficiently cover the silicon nitride spacers 202a, 202b. Subsequently, a polysilicon gate 204 is formed on the second oxide layer 224 and excessively filling the trench 216, wherein a source/drain region 206a, 206b is formed on both sides of the polysilicon gate 204 in the substrate 200.

Figure 1:
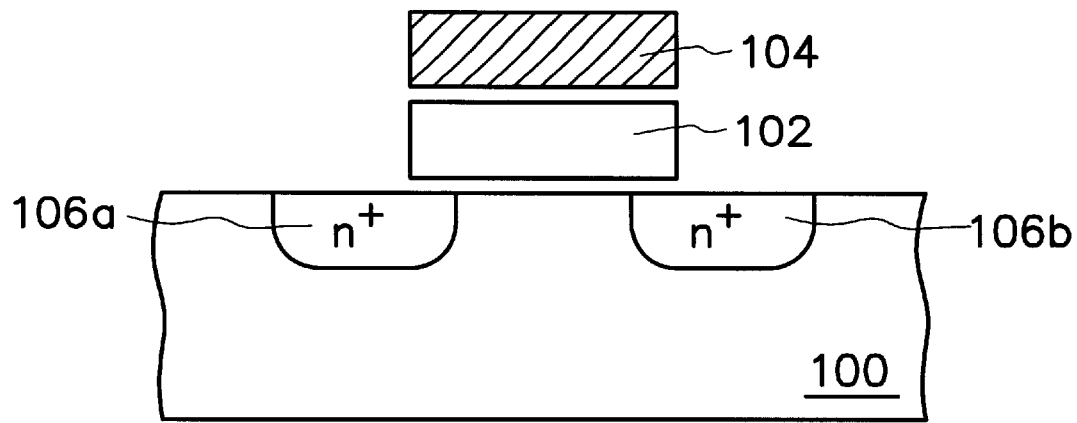
FIG. 1 is a schematic, cross-sectional view of a flash memory cell according to the prior art.

Compared with the conventional flash memory cell as illustrated in FIG. 1, the present invention provides two silicon nitride components for storing the hot electrons. The two silicon nitride components are the first silicon nitride spacer 202a and the second silicon nitride spacer 202b as shown in FIG. 2. As a result, the present invention provides a 2-bit flash memory cell in which charge redistribution is prevented.

FIGS. 3A to 3E are schematic, cross-sectional views showing the manufacturing of a flash memory cell according to the present invention.

Figure 3A:
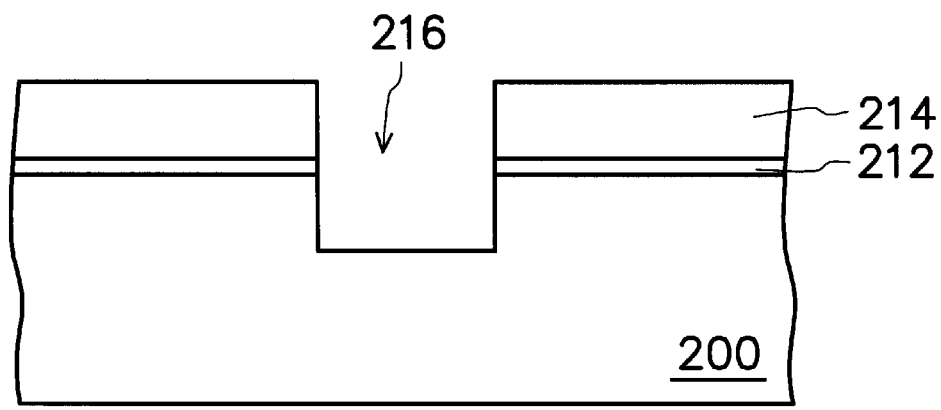
FIGS. 3A to 3E are schematic, cross-sectional views showing the manufacturing of a flash memory cell according to the present invention.

Referring to FIG. 3A, a pad oxide layer (not shown) and a silicon nitride layer (not shown) are sequentially formed on the substrate 200, which is, for example, a P-type silicon substrate, followed by patterning the pad oxide layer and the silicon nitride layer. With the patterned pad oxide layer 212 and the patterned silicon nitride layer 214 serving as a mask, the substrate 200 is etched to form a shallow trench 216, wherein the trench 216 comprises a left sidewall and a right sidewall.

Figure 3B:
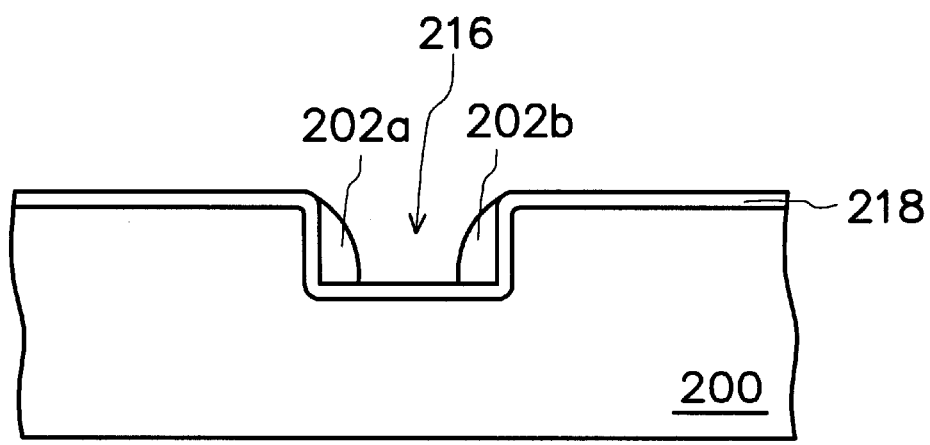

Referring to FIG. 3B, the patterned silicon nitride layer 214 (FIG. 3A) and the pad oxide layer 212 (FIG. 3A) are removed. Although the shallow trench 216 is formed following the techniques disclosed in the above, a shallow trench 216 formed by other techniques still falls within the scope and spirit of the present invention.

Still referring to FIG. 3B, a conformal ultra thin oxide layer 218 of about 30Å to about 100Å thick is formed on the substrate 200. A first silicon nitride spacer 202b is then formed on the ultra thin oxide layer 218 that covers the right sidewall of the shallow trench 216. Concurrently, a second nitride spacer 202a is formed on the ultra thin oxide layer 218 covering the left sidewall of the trench 216. The first silicon nitride spacer 202b and the second silicon nitride spacer 202a are formed by, for example, forming a silicon nitride layer on the substrate 200 (not shown), excessively filling the trench 216, followed by back-etching the silicon nitride layer using the substrate 200 surface outside the trench 216 as an etching end-point.

Figure 3C:
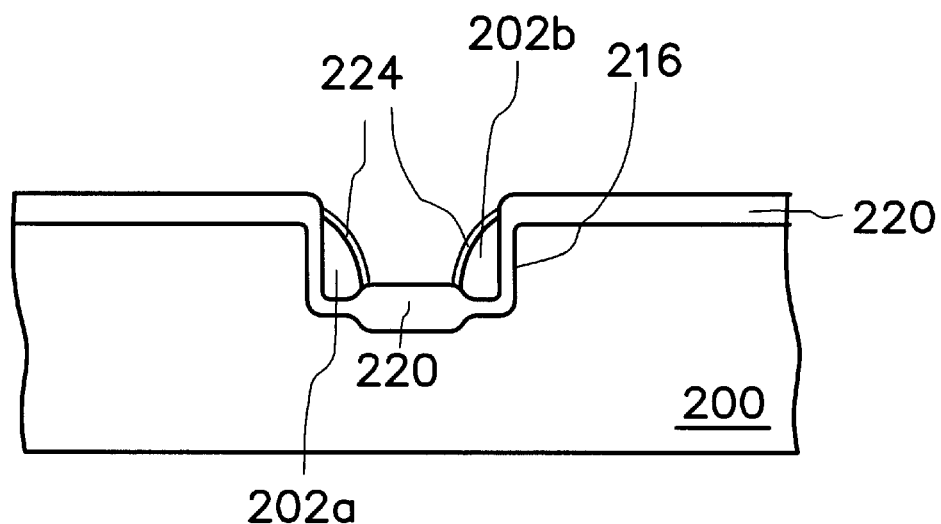

As shown in FIG. 3C, a gate oxide layer 224 is then formed on the silicon nitride spacers 202b, 202a. The gate oxide layer 224 can be formed by two methods. One method is to grow a very thin oxide layer on the silicon nitride spacers 202a, 202b by means of thermal oxidation. The ultra thin oxide layer 218 (FIG. 3B) which is not covered by the silicon nitride spacers 202b, 202a becomes thicker. The thickening rate for the ultra thin oxide layer 218 is much faster than the growth rate of the gate oxide layer 224. The portion of the ultra thin oxide layer that becomes thicker is indicated as 220.

Another gate oxide layer formation method includes deposition, for example, forming a conformal gate oxide layer (not shown) on the substrate 200 by means of chemical vapor deposition. In such a case, the thickness of the gate oxide layer 224 on the silicon nitride spacers 202a, 202b is the same as that on the ultra thin oxide layer 218 (as in FIG. 3B).

Figure 3D:
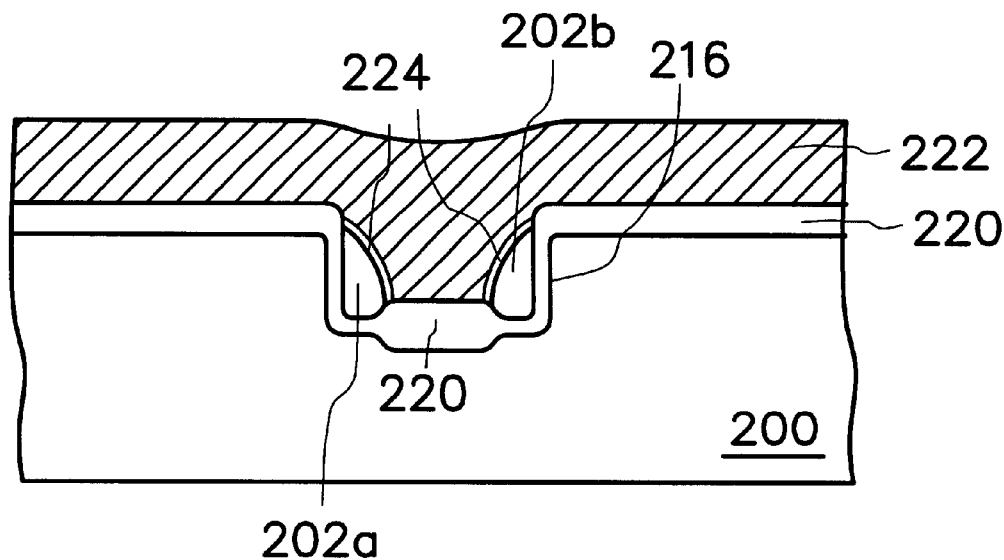

Referring to FIG. 3D, a polysilicon layer 222 is formed on the substrate 200, in which the polysilicon layer 222 excessively fills the trench 216 to cover the gate oxide layer 224.

Figure 3E:
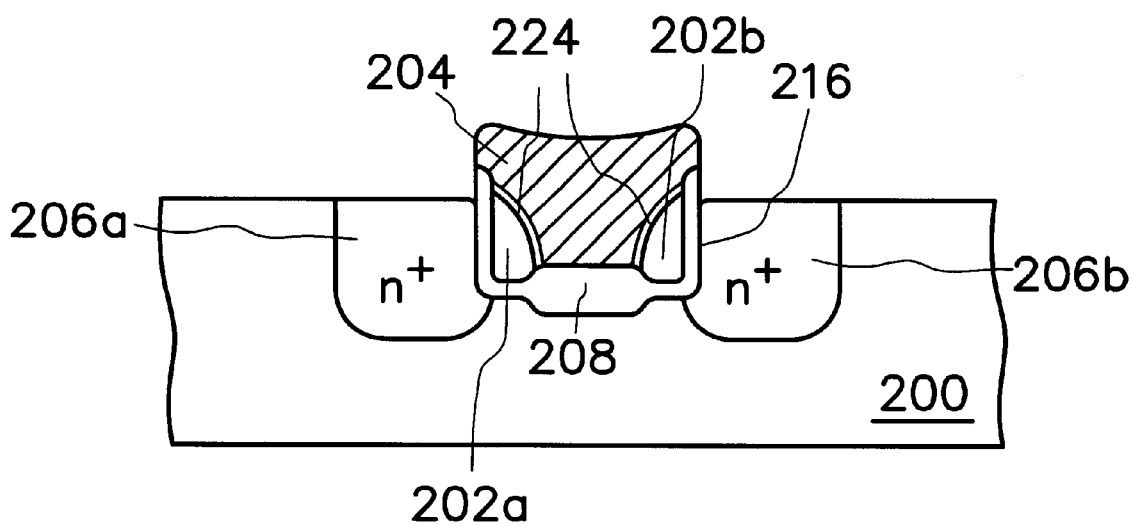

Continuing to FIG. 3E, the polysilicon layer 222 (FIG. 3D) is patterned and etched to form a polysilicon gate 204. The ultra thin oxide layer 220 (FIG. 3C) on the substrate 200 surface is also etched to form a patterned ultra thin oxide layer 208.

Thereafter, an ion implantation is conducted at the two sides of the polysilicon gate 204 in the substrate 200 to form a source region 206a and a drain region 206b, wherein the implanted ion can be an N-type dopant to form an N-type source/drain region.

Mechanisms of the different operations performed by the flash memory cell according to by the present invention are described herein below.

When the stored data is subjected to be erased, a positive voltage is applied to the source/drain regions 206a, 206b and a negative voltage is applied to the polysilicon gate 204 as shown in FIG. 3E and FIG. 2, forcing the trapped hot electrons to flow outward from the silicon nitride spacers 202b, 202a and tunnel through the ultra thin oxide layer 208 underneath the silicon nitride spacers 206a, 206b. Once the hot electrons are evacuated, the memory is erased.

When a bit of data is written to a memory cell, a positive charge Vcc is applied to the drain region 206 as the source region is normally grounded. In addition, a higher positive voltage is applied to the polysilicon gate 204. Since the drain region 206b is not protected with a lightly doped drain (LDD), a significant increase in the number of the carriers occurs at the junction between the drain region 206b and the substrate 200. A portion of the hot electrons generated is collected in the drain region 206b. A portion of the hot electrons, however, is driven to pass through the ultra thin oxide layer 208 and inject into the first silicon nitride spacer 202b due to the strong electric field created at the polysilicon gate 204. The first silicon nitride spacer 202b becomes charged. Once the hot electrons are in the first silicon nitride spacer 202b, they are trapped by the high-energy barrier of the surrounding ultra thin oxide layer 208 and reside therein.

When data stored in a memory according to the above programming operation are subject to be read, a positive voltage is applied to the polysilicon gate 204 and a lower positive voltage is applied to the drain region 206b. If there are trapped electrons in the first silicon nitride spacer 202b, there are no electrons flowing toward the drain region 206b, and a pre-defined binary data unit of "1" or "0" is read. Otherwise, a pre-defined binary data unit of "0" or "1" is read if there are no electrons trapped inside the first silicon nitride spacer 202b.

The present invention, in addition, further provides another flash memory cell programming operation in which a positive charge Vcc is applied on the source region 206a as the drain region 206b is grounded. In addition, a higher positive voltage is applied to the polysilicon gate 204. Besides a portion of the hot electrons generated being collected in the source region 206a, a portion of the hot electrons passes through the ultra thin oxide layer 208 and is injected into the second silicon nitride spacer 202a due to the strong electric field created at the polysilicon gate 204. The second silicon nitride spacer 202b then becomes charged.

When the data stored in a memory according to above programming operation are subject to be read, a positive voltage is applied to the polysilicon gate 204 and a lower positive voltage is applied to the source region 206a. If there are trapped electrons within the second silicon nitride spacer 202a, there are no electrons flowing toward the source region 206a. Therefore a pre-defined binary data unit of "1" is read. Otherwise, a pre-defined binary data unit of "0" is read if there are no electrons trapped inside the second silicon nitride spacer 202a.

Based on the above approaches, the first silicon nitride spacer 202b and the second silicon nitride spacer 202a can both be used for storing data. The flash memory cell of this structure can have four different charge conditions (0,0), (0,1), (1,0), (1,1). The present invention thus provides a 2-bit flash memory cell.

The present invention provides at least the following upgrade of the functions of a flash memory cell. The present invention provides two isolated silicon nitride spacers to mitigate the problem of redistribution of charge as seen in the prior art. Since the occurrence of redistribution is prevented, the problem of an over-erasure is also eliminated. Since the present invention provides two isolated silicon nitride spacers for storing data, a 2-bit flash memory cell is provided.

Although in the above embodiment the present invention has been described with respect to a P-type silicon substrate and an N-type source/drain region, the invention is also applicable to an N-type silicon substrate and a P-type source/drain region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory cell comprising: a substrate comprising a trench, wherein the trench is sequentially filled with:
   a conformal first oxide layer;
   a silicon nitride spacer on the first oxide layer;
   a second oxide layer on the silicon nitride spacer;
   a polysilicon gate on the second oxide layer and filling the trench; and
   a source/drain region on two sides of the gate in the substrate.

2. The flash memory cell according to claim 1, wherein the substrate is a P-type silicon substrate.

3. The flash memory cell according to claim 2, wherein the source/drain region is an N-type source/drain region.

4. The flash memory cell according to claim 1, wherein the substrate is a P-type silicon substrate.

5. The flash memory cell according to claim 4, wherein the source/drain region is an N-type source/drain region.

* * * * *